United States Patent
Kim et al.

(10) Patent No.: US 7,273,783 B2
(45) Date of Patent: Sep. 25, 2007

(54) METHODS FOR REDUCING VOID FORMATION IN SEMICONDUCTOR DEVICES

(75) Inventors: Jong-Won Kim, Gyeonggi-do (KR); Jong-Ho Park, Seoul (KR); Jung-Dal Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 11/018,778

(22) Filed: Dec. 21, 2004

(65) Prior Publication Data

US 2006/0030137 A1    Feb. 9, 2006

(30) Foreign Application Priority Data

Aug. 4, 2004    (KR)    ............... 10-2004-0061473

(51) Int. Cl.
   *H01L 21/336*    (2006.01)
(52) U.S. Cl. ............... 438/259; 438/594; 438/596; 257/E21.624
(58) Field of Classification Search ............... 438/259, 438/594, 595, 657; 257/E21.588, E21.621, 257/E21.624
   See application file for complete search history.

(56) References Cited

U.S. PATENT DOCUMENTS

| | | | | |
|---|---|---|---|---|
| 4,714,520 | A * | 12/1987 | Gwozdz | ............... 438/699 |
| 6,489,253 | B1 | 12/2002 | Ngo et al. | ............... 438/763 |
| 6,555,434 | B2 * | 4/2003 | Koh | ............... 438/257 |
| 2003/0006448 | A1 * | 1/2003 | Mehrad et al. | ............. 438/257 |
| 2004/0211357 | A1 | 10/2004 | Gadgil et al. | ................. 117/84 |

FOREIGN PATENT DOCUMENTS

| | | |
|---|---|---|
| KR | 1020020067787 A | 8/2002 |
| KR | 10-2004-0003895 | 1/2004 |
| KR | 10-2004-0004896 | 1/2004 |
| KR | 1020040001293 A | 1/2004 |

OTHER PUBLICATIONS

"Silicon Processing for the VLSI era: vol. 1-Process Technology," (1990, Lattice Press) by Stanley Wolf, p. 185.
"Silicon Processing for the VLSI era: vol. 2-Process Integration," (1990, Lattice Press) by Stlaney Wolf, p. 202.
Notice to File a Response/Amendment to the Examination Report corresponding to Korean Patent Application No. 10-2004-0061473 mailed Jan. 31, 2006.

* cited by examiner

*Primary Examiner*—Chandra Chaudhari
(74) *Attorney, Agent, or Firm*—Myers Bigel Sibley & Sajovec, PA

(57) ABSTRACT

A method of forming a semiconductor device includes forming an insulating layer on a semiconductor substrate. The insulating layer has a trench therein with opposing sidewalls and a bottom surface. A first conductive layer is formed on the sidewalls and on the bottom surface of the trench to define a gap region. A portion of the first conductive layer is removed to thereby increase a width of the gap region. The first conductive layer may be removed from the sidewalls and the bottom surface of the trench such that an upper width of the gap region is greater than or equal to a lower width of the gap region. A second conductive layer is formed in the gap region after removing the portion of the first conductive layer to fill the gap region.

32 Claims, 9 Drawing Sheets

(Prior Art)

Fig. 4

(Prior Art)

METHODS FOR REDUCING VOID FORMATION IN SEMICONDUCTOR DEVICES

CLAIM OF PRIORITY

This application claims priority from Korean Patent Application No. 2004-61473, filed on Aug. 4, 2004 in the Korean Intellectual Property Office, the entire disclosure of which is hereby incorporated by reference herein in its entirety.

BACKGROUND OF THE INVENTION

1. Field of the Invention

The present invention relates to semiconductor devices, and more particularly, to methods for forming field effect transistors (FETs) and related devices.

2. Description of Related Art

Conventional methods of forming semiconductor devices, such as field effect transistors (FETs), may include the steps of forming a device isolation layer in predetermined regions of a semiconductor substrate to define transistor active regions, and forming gate electrodes crossing over the active regions. For example, in forming the device isolation layer, a trench mask pattern may be formed on the substrate. Using the trench mask pattern as an etch mask, the semiconductor substrate may be anisotropically etched to define a transistor active region having trenches on either side. The device isolation layer may be formed in the trenches on each side of the active region. Such a technique is known as shallow trench isolation (STI). In forming the gate electrode, a gate insulating layer and a gate conductive layer may be sequentially formed on the active region. The gate conductive layer may be patterned to form the gate electrode on the active region.

Non-volatile memory devices, such as flash memory devices, may further include a floating gate electrode positioned below the gate electrode. Forming the floating gate electrode may include two patterning steps using different mask patterns, which may be oriented horizontally and/or vertically with respect to the active region. A vertical patterning step may be similar to a step used for forming the gate electrode. However, a horizontal patterning step may require additional photolithographic steps and/or may involve precise photolithographic parameters, such as for an overlay.

With increasing demand for higher device integration density, it may be more difficult to achieve such precise photolithographic parameters. Accordingly, alternative patterning methods have been developed. For example, the floating gate conductive layer may be patterned using self-aligning methods.

Conventional methods for patterning a floating gate conductive layer will now be described with reference to FIG. 1 through FIG. 4.

Figure 1:
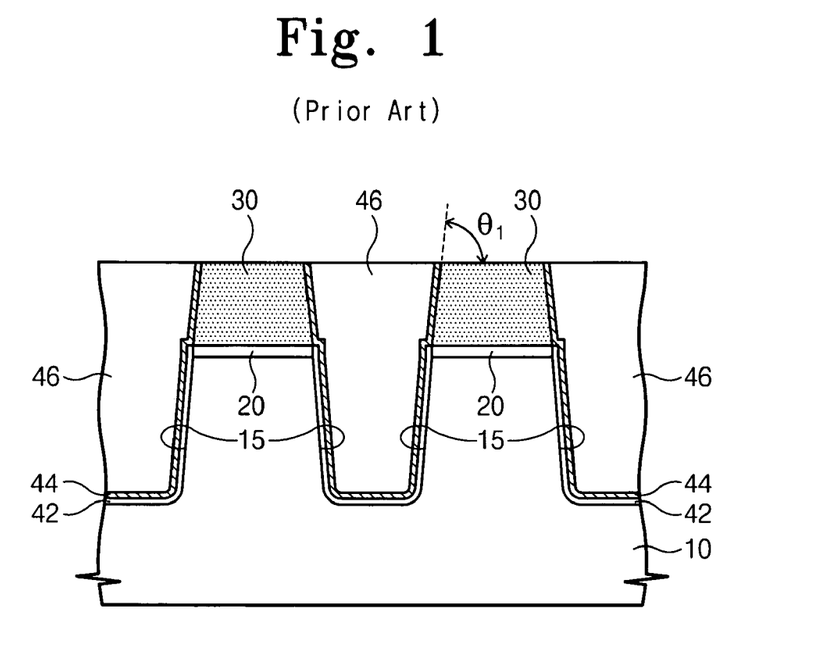
FIG. 1 through FIG. 4 are cross-sectional views illustrating conventional methods for forming a conductive layer on a semiconductor substrate.

As illustrated in FIG. 1, a pad oxide layer 20 is formed on a semiconductor substrate 10. The pad oxide layer 20 may be formed of silicon oxide. Trench mask patterns 30 are formed on a predetermined region of the pad oxide layer 20. Using the trench mask patterns 30 as etch masks, the pad oxide layer 20 and the substrate 10 are anisotropically etched to form trenches 15 around the trench mask patterns 30. The trenches 15 define active regions of the substrate 10 where an inversion layer channel may be formed. A thermal oxide layer 42 may be formed on sidewalls of the trenches 15, and a nitride liner 44 may be formed on the thermal oxide layer 42.

The trench 15 may be formed to a depth of about 2,000 to about 4,000 angstroms (Å). The trench mask pattern 30 may be made of a material such as silicon nitride that is etch-resistant with respect to the etchant used to form the trench 15. However, during the etching process, top and lateral surfaces of the trench mask pattern 30 may be partially etched, and as a result, sidewalls of the trench mask pattern 30 may be formed at an incline. In other words, etching may be greater at upper portions of the sidewalls of the trench mask pattern 30 than at lower portions thereof, such that upper portions of the trench mask pattern 30 may be narrower than lower portions. As such, the trench mask pattern 30 has inclined sidewalls. More particularly, an inclination angle $\theta_1$ of a sidewall of the trench mask pattern 30 is less than 90 degrees.

A device isolation layer is formed on the trench mask pattern 30 and in the trench 15. The device isolation layer is then planarized until a top surface of the trench mask pattern 30 is exposed to form a device isolation layer 46 that fills the trench 15. The device isolation layer 46 may be formed of silicon oxide.

Figure 2:
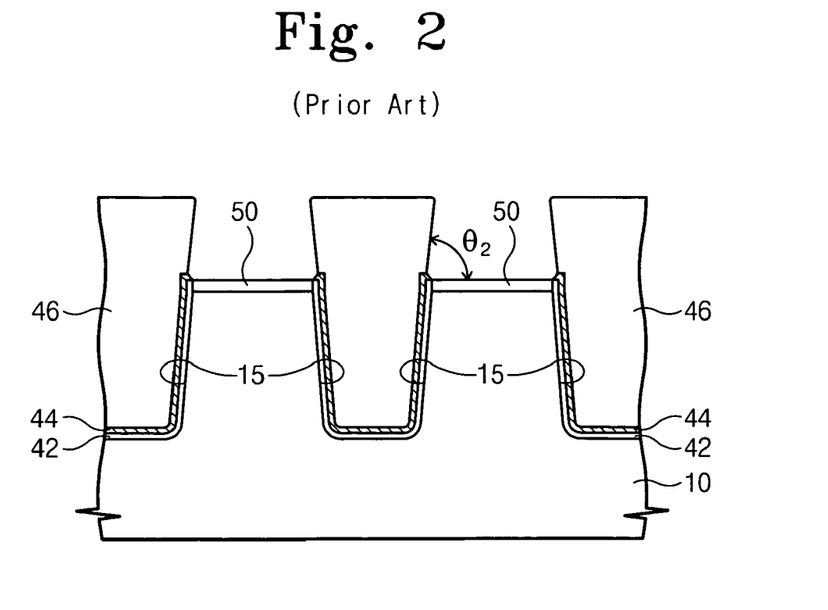

Referring to FIG. 2, the trench mask pattern 30 is removed to expose the pad oxide layer 20. The trench mask pattern 30 may be removed in a manner that minimizes etching of the device isolation layer 46. The pad oxide layer 20 is removed to expose the active region of the substrate 10. As such, a trench is formed with opposing sidewalls defined by the device isolation layer 46 and a bottom surface defined by the active region of the substrate 10. The device isolation layer 46 also has inclined sidewalls. A gate insulating layer 50 is then formed on the exposed active region.

During removal of the pad oxide layer 20, the device isolation layer 46 may also be etched. In order to reduce etching damage at the active region of the substrate 10, removal of the pad oxide layer 20 may be performed using anisotropic etching. As a result, the sidewalls of the device isolation layer 46 remain at an incline. However, a sidewall inclination angle $\theta_2$ of the device isolation layer 46 may be different than the sidewall inclination angle $\theta_1$ of the trench mask pattern 30.

Figure 3:
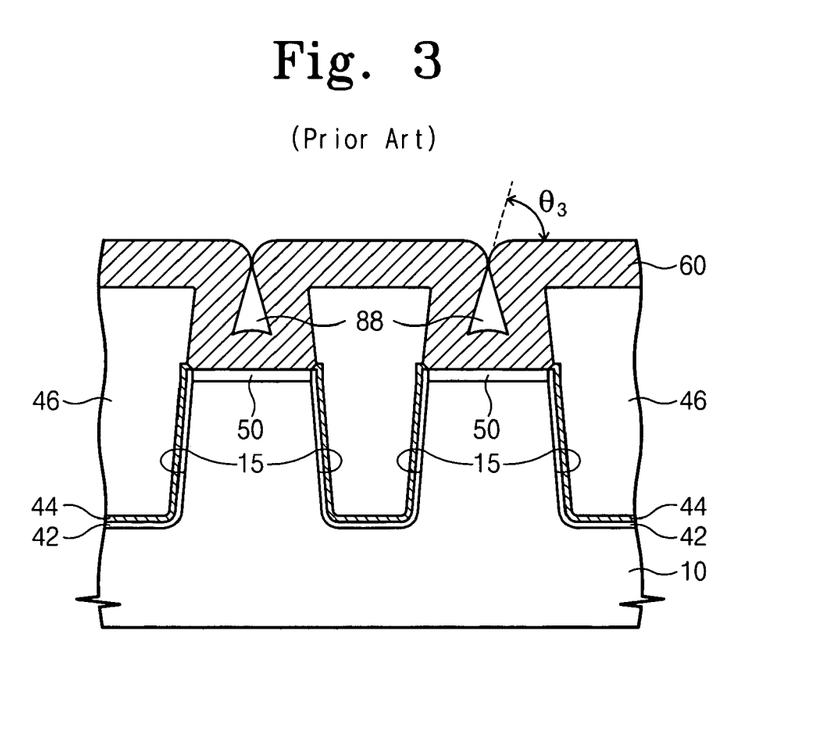
Figure 4:
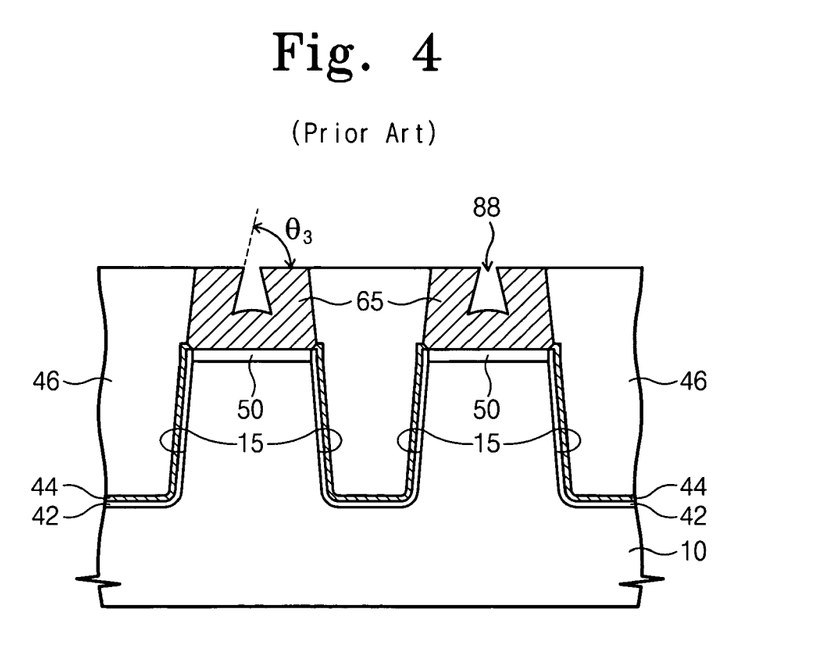

As illustrated in FIG. 3 and FIG. 4, a first conductive layer 60 is formed on the gate insulation layer 50 and the device isolation layer 46. The first conductive layer 60 may be formed using chemical vapor deposition (CVD). The first conductive layer 60 is then planarized until a top surface of the device isolation layer 46 is exposed to form a first conductive pattern 65 that is self-aligned between the inclined sidewalls of the device isolation layer 46.

In the event that a layer of a predetermined material, such as the first conductive layer 60, is deposited on a structure having a predetermined gap area, such as the trench defined by the device isolation layer 46 and the active region of the substrate 10, voids 88 may be formed due to poor step coverage. This is discussed, for example, in "Silicon Processing for the VLSI era: Volume 1—Process Technology" (1990, Lattice Press) by Stanley Wolf, p. 185, and "Silicon Processing for the VLSI era: Volume 2—Process Integration" (1990, Lattice Press) by Stanley Wolf, p. 202. More particularly, where the device isolation layer 46 has a sidewall inclination angle that is smaller than a right angle (i.e. $\theta_2 < 90°$), a sidewall of the first conductive layer 60 formed on the device isolation layer 46 may have an even smaller inclination angle $\theta_3$. This may result in an overhang, as illustrated in FIG. 3. As such, the formation of voids 88 may be more likely. The voids 88 may contribute to device failures, as well as non-uniform device characteristics.

SUMMARY OF THE INVENTION

Embodiments of the present invention may provide methods for reducing void formation in fabricating conductive patterns in semiconductor devices In addition, embodiments of the present invention may provide methods for reducing void formation in fabricating floating gate electrodes in flash memory devices.

Moreover, embodiments of the present invention may provide floating gate electrodes having more uniform electrical characteristics.

According to some embodiments of the present invention, a method of forming a semiconductor device may include forming an insulating layer on a semiconductor substrate. The insulating layer may have a trench therein with opposing sidewalls and a bottom surface. A first conductive layer may be formed on the sidewalls and on the bottom surface of the trench to define a gap region. A portion of the first conductive layer may be removed to thereby increase a width of the gap region. A second conductive layer may then be formed in the gap region after removing the portion of the first conductive layer to fill the gap region.

In some embodiments, removing a portion of the first conductive layer may include removing a portion of the first conductive layer from the sidewalls and the bottom surface of the trench such that an upper width of the gap region is greater than or equal to a lower width of the gap region.

In other embodiments, forming the insulating layer may include forming the insulating layer to define a trench having sidewalls inclined at an angle of no greater than 90 degrees. Also, removing a portion of the first conductive layer may include etching the first conductive layer to form a widened gap region having sidewalls inclined at an angle of at least 90 degrees.

In further embodiments, etching the first conductive layer may include etching a portion of the first conductive layer on upper sidewalls of the trench to a greater extent than portions of the first conductive layer on lower sidewalls of the trench such that a width of the widened gap region gradually decreases from top to bottom. Etching the first conductive layer may include etching the first conductive layer using a wet and/or dry etch-back process.

In some embodiments, the method may further include forming an auxiliary pattern in the gap region prior to removing a portion of the first conductive layer. Removing a portion of the first conductive layer may include etching the first conductive layer, and the auxiliary pattern may have a higher etch rate than the first conductive layer. In addition, removing a portion of the first conductive layer may further include removing the auxiliary pattern. The auxiliary pattern may be formed of an insulating material. Moreover, the auxiliary pattern may be formed of silicon oxide, silicon nitride, silicon oxynitride, and/or spin-on glass (SOG).

In other embodiments of the present invention, the first and second conductive layers may be formed of a same material. Moreover, the first and second conductive layers may be formed of polysilicon.

In further embodiments, forming a first conductive layer may include forming the first conductive layer to a thickness that is less than half of a distance between the sidewalls of the trench.

In some embodiments, forming a first conductive layer may further include forming the first conductive layer on the insulating layer outside the trench. After forming the second conductive layer, the first conductive layer may be planarized to expose a top surface of the insulating layer.

In other embodiments, forming a first conductive layer may further include forming the first conductive layer on the insulating layer outside the trench. The first conductive layer may be planarized to expose a top surface of the insulating layer before forming the second conductive layer. In addition, forming a second conductive layer may further include forming the second conductive layer on the insulating layer outside the trench. The second conductive layer may be planarized to expose the top surface of the insulating layer.

In further embodiments, the insulating layer may be a device isolation layer. Forming the insulating layer may include forming a trench mask pattern on an active region of the substrate. The substrate may be etched around the mask pattern to form trenches on either side of the active region. The device isolation layer may be formed on the substrate to fill the trenches on either side of the active region. The device isolation layer may then be planarized to expose a top surface of the trench mask pattern, and the trench mask pattern may be removed.

In some embodiments, forming the first conductive layer may include forming the first conductive layer using physical vapor deposition (PVD) and/or low pressure chemical vapor deposition (LPCVD).

According to some embodiments of the present invention, a method of forming a memory device may include forming a device isolation layer on a semiconductor substrate. The device isolation layer may have a trench therein with opposing sidewalls and a bottom surface above an active region of the substrate. An oxide layer may be formed on the bottom surface of the trench, and a first conductive layer may be formed on the sidewalls and on the bottom surface of the trench to define a gap region. A portion of the first conductive layer may be removed to thereby increase a width of the gap region. A second conductive layer may then be formed in the gap region after removing the portion of the first conductive layer to fill the gap region. A dielectric layer may be formed on the first and second conductive layers, and a control gate electrode may be formed on the dielectric layer.

In other embodiments, removing a portion of the first conductive layer may include removing a portion of the first conductive layer from the sidewalls and the bottom surface of the trench such that an upper width of the gap region is greater than or equal to a lower width of the gap region.

In further embodiments, forming the device isolation layer may include forming the device isolation layer to define a trench having sidewalls inclined at an angle of no greater than 90 degrees. Moreover, removing a portion of the first conductive layer may include etching the first conductive layer to form a widened gap region having sidewalls inclined at an angle of at least 90 degrees.

In some embodiments, an auxiliary pattern may be formed in the gap region prior to removing a portion of the first conductive layer. Removing a portion of the first conductive layer may include etching the first conductive layer, and the auxiliary pattern may have a higher etch rate than the first conductive layer. In addition, removing a portion of the first conductive layer may further include removing the auxiliary pattern.

In other embodiments, the auxiliary pattern may be formed of an insulating material, such as silicon oxide, silicon nitride, silicon oxynitride, and/or spin-on glass (SOG). Moreover, the first and second conductive layers may be formed of a same material, such as polysilicon.

According to further embodiments of the present invention, a method for forming conductive patterns of a semiconductor device may include forming mold patterns on a predetermined region of a semiconductor substrate. A first material layer may be deposited on a resultant structure where the mold patterns are formed, and a gap area may be formed having a top region and a bottom region between the mold patterns. The first material layer may be etched to widen the gap area. A top width of the widened gap area may be larger than or equal to a bottom width thereof. A second material layer may be formed on a resultant structure including the etched first material layer to fill the widened gap area. The second material layer and the etched first material layer may be planarized to expose top surfaces of the mold patterns.

In some embodiments, forming mold patterns may include forming trench mask patterns on the semiconductor substrate. Using the trench mask patterns as an etch mask, the semiconductor substrate may be anisotropically etched to form a trench defining the active region. A device isolation layer may be formed on a resultant structure where the trench mask patterns are formed, filling the trench. The device isolation layer may be planarized to form the mold patterns exposing the top surfaces of the trench mask patterns. The exposed trench mask patterns may then be removed.

In some embodiments, the first and second material layers may be made of polysilicon. Forming the first material layer may be conducted using physical vapor deposition (PVD) and/or low pressure chemical vapor deposition (LPCVD). The first material layer may have a thickness that is smaller than half of a minimum space between the mold patterns.

In some embodiments, etching of the first material layer may be conducted using an etch-back process performed by a dry etch and/or a wet etch.

Following formation of the first material layer, the method may further include forming an auxiliary pattern to fill the gate area while exposing a top surface of the first material layer. The auxiliary pattern may be made of a material having a higher etch rate than the first material layer under the same etching conditions used to etch the first material layer.

Embodiments of the present invention may also provide a floating gate electrode in a flash memory device. The gate structure may include isolation layer patterns formed at a predetermined region of a semiconductor substrate to define active regions, a first conductive pattern formed on the active regions to define a widened trench area, and a second conductive pattern formed on the first conductive pattern to fill the widened trench area. The first conductive pattern may have a sidewall portion and a lower portion. A top width of the widened trench area may be greater than or equal to a bottom width thereof.

In some embodiments, a top of the sidewall portion may be thinner than a bottom thereof. The second conductive pattern and the device isolation layer pattern may taper off downwardly. In other words, widths of the second conductive pattern and the device isolation pattern may gradually decrease from top to bottom.

DETAILED DESCRIPTION OF THE INVENTION

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

A method for fabricating a semiconductor device according to some embodiments of the present invention will now be described with reference to FIG. 5 through FIG. 7. Methods for fabricating a semiconductor device according to further embodiments of the present invention will be described with reference to FIG. 8 and FIG. 9.

Figure 5:
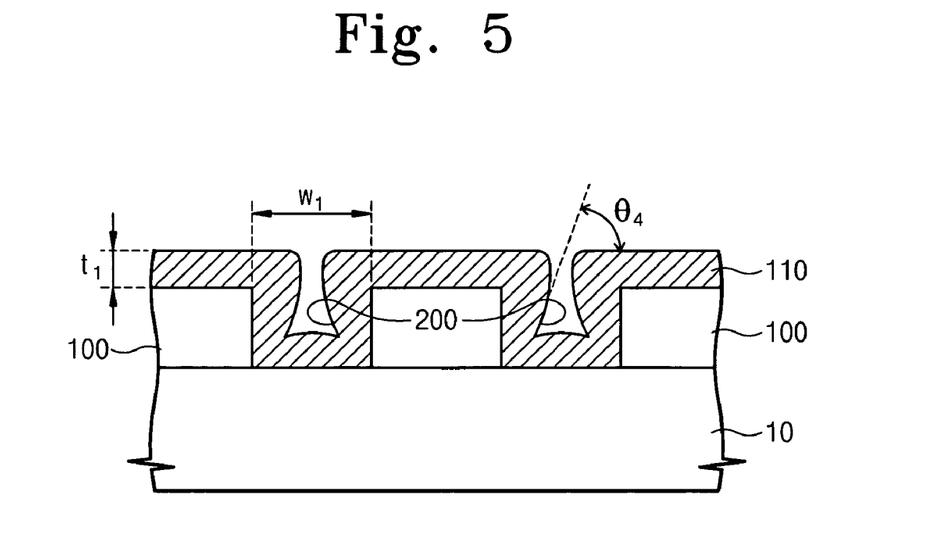
FIG. 5 through FIG. 7 are cross-sectional views illustrating methods for fabricating a semiconductor device according to some embodiments of the present invention.

Referring now to FIG. 5, mold patterns 100 are formed on predetermined regions of a semiconductor substrate 10. The mold patterns 100 may be an insulating layer that is formed on predetermined regions of the substrate 10 to define trenches having opposing sidewalls defined by the insulating layer and a bottom surface defined by the substrate 10. A first material layer 110 is formed on the surface of the mold patterns 100 and the substrate 10. In other words, the first material layer 110 may be formed on the sidewalls and the bottom surface of the trench. The first material layer 110 may be formed using chemical vapor deposition (CVD) and/or physical vapor deposition (PVD). The first material layer 110 may have a thickness $t_1$ that is less than half of the distance $w_1$ between mold patterns 100 (i.e., $t_1 < w_1/2$). As a result, gap areas 200 defined by the first material layer 100 are formed between the mold patterns 100. Due to the step coverage problems described earlier, an inner sidewall of the gap area 200 may have an inclination angle $\theta_4$ that is less than 90 degrees.

Figure 6:
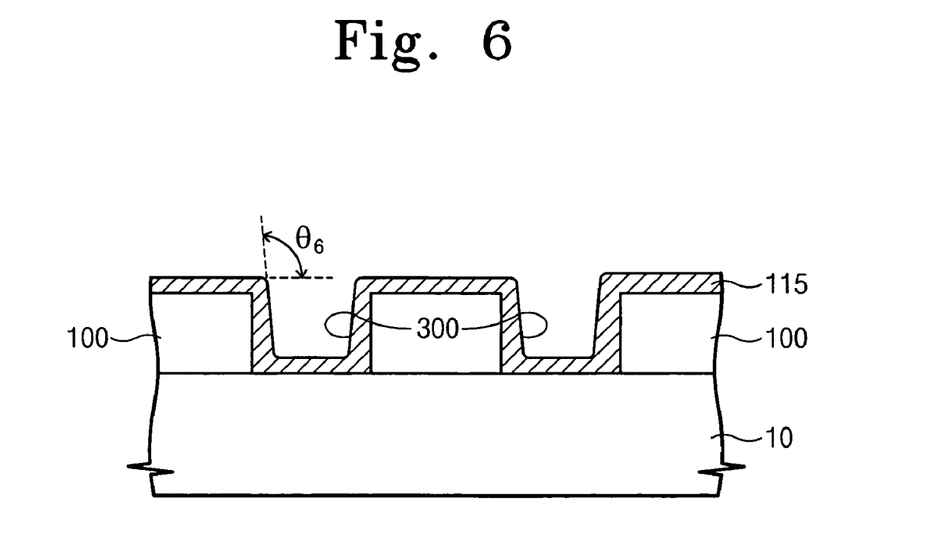

As illustrated in FIG. 6, the first material layer 110 is etched to increase the size of the gap area 200. As such, a portion of the first material layer 110 is removed from the sidewalls and the bottom surface of the trench. Thus, a reduced first material layer 115 and a widened gap 300 are formed. An upper width of the widened gap 300 is greater than or equal to a lower width thereof. The widened gap 300 may be formed by anisotropically etching the first material layer 110 using a dry etching process. As a result, the inner sidewall portion of the first material layer 110 (i.e., the upper portion that defines the opening for the gap area 200) is subjected to increased etching, such that a top portion of the widened gap 300 is wider than a bottom portion thereof. In other words, the width of the widened gap 300 gradually decreases from top to bottom. As such, a sidewall of the widened gap 300 may be formed at an angle $\theta_6$ of at least 90 degrees.

Figure 7:
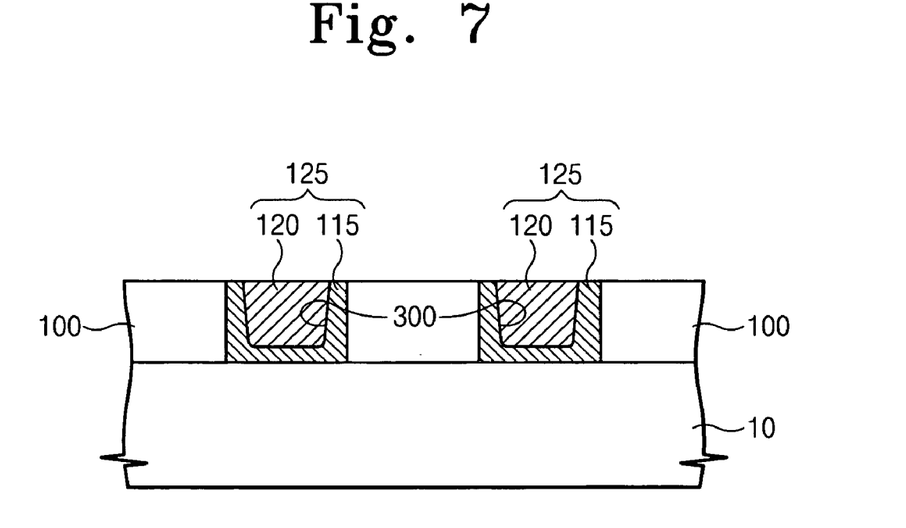

Referring to FIG. 7, a second material layer 120 is formed on the reduced first material layer 115 and the widened gap 300, filling the widened gap 300. The second material layer 120 may be made of the same material as the first material layer 110. As described above, the top width of the widened gap 300 is larger than the bottom width. Thus, the second material layer 120 may be formed in the widened gap 300 with a reduced possibility of over-hang, making void formation less likely. As such, void-based problems may be avoided by using the second material layer 120 to fill the widened gap 300.

According to other embodiments of the present invention, the second material layer 120 may include multi-stacked material layers. The top width of the gap area 200 may be increased to form the widened gap 300 prior to formation of the multi-stacked material layers.

Still referring to FIG. 7, the second material layer 120 and the reduced first material layer 115 are planarized until a top surface of the mold patterns 100 is exposed. As a result, a space between the mold patterns 100 is filled with a material pattern 125 that includes a portion of the reduced first material layer 115 and the second material layer 120 which are stacked.

Figure 8:
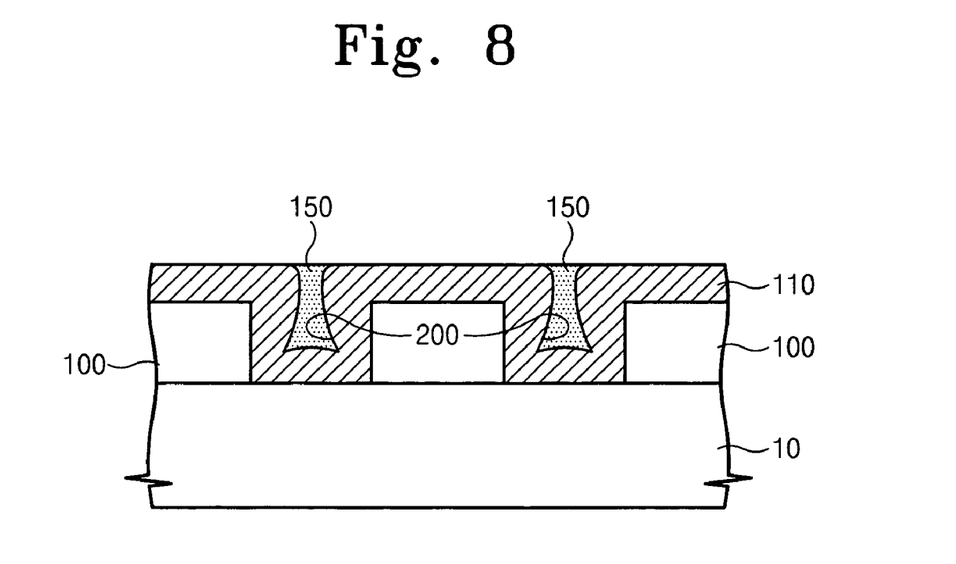
FIG. 8 and FIG. 9 are cross-sectional views illustrating methods for fabricating a semiconductor device according to further embodiments of the present invention.

The widened gap 300 shown in FIG. 6 may also be formed using methods according to further embodiments of the present invention as described with reference to FIG. 8 and FIG. 9. As illustrated in FIG. 8, after forming the first material layer 110, an auxiliary pattern 150 is formed to fill the gap area 200. The auxiliary pattern 150 may be formed such that a top surface of the first material layer 110 is exposed. As such, formation of the auxiliary pattern 150 may include forming an auxiliary layer on the first material layer 110 to fill the gap area 200, and planarizing the auxiliary layer until the top surface of the first material layer 110 is exposed. Thereafter, the exposed top surface of the first material layer 110 is etched. Etching of the first material layer 110 may be performed using isotropic wet etching. Alternatively, etching may be performed using anisotropic etching.

Figure 9:
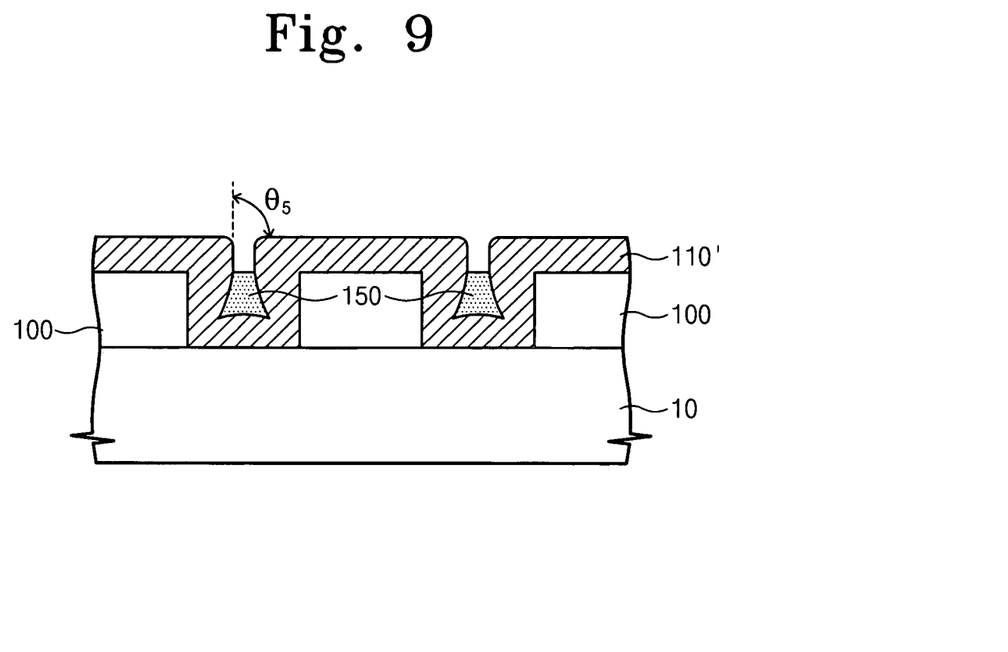

Referring now to FIG. 9, the auxiliary pattern 150 may be formed of a material having a higher etch rate than the first material layer 110 under the same etching conditions. Accordingly, a top surface of the auxiliary pattern 150 is etched more quickly than that of the first material layer 110. As such, while the first material layer 110 is etched, the auxiliary pattern 150 is etched at a higher rate, exposing upper sidewalls of the gap area 200. Over time, the exposed sidewalls of the gap area 200 may extend vertically. In other words, the exposed upper sidewalls may have an inclination angle $\theta_5$ of about 90 degrees. As a result, etching may be greater at the upper sidewalls of the gap area 200 than at lower sidewalls thereof to form the widened gap 300.

Etching of the first material layer 110 may be performed until the auxiliary pattern 150 is removed. As a result, an inner sidewall of the reduced first material layer 115 (i.e., an inner sidewall of the widened gap 300) may have an inclination angle $\theta_6$ of at least 90°, as illustrated in FIG. 6. The auxiliary pattern 150 may be formed of silicon oxide, silicon nitride, silicon oxynitride, and/or spin-on-glass (SOG). Since different materials may be etched at different etch rates, the auxiliary pattern 150 may be formed of various materials having etch selectivities with respect to the first material layer 110. In other words, the composition of the auxiliary pattern 150 may include, but is not limited to, the materials described above.

Methods for forming void-free material patterns as described above with reference to FIG. 5 through FIG. 9 may also be applicable to the fabrication of floating gate electrodes in flash memory. FIG. 10 through FIG. 13 are cross-sectional views illustrating methods for fabricating a floating gate electrode in a flash memory device according to some embodiments of the present invention. The steps of forming a trench 15 in a semiconductor substrate 10, forming a device isolation layer 46 in the trench 15, and removing the trench mask patterns 30, as described above with reference to FIG. 1 and FIG. 2, may be identically performed in this embodiment. Thus, these steps will not be described in further detail. The device isolation layer 46 may correspond to the mold patterns 100 described with reference to the embodiments of FIG. 5.

Figure 10:
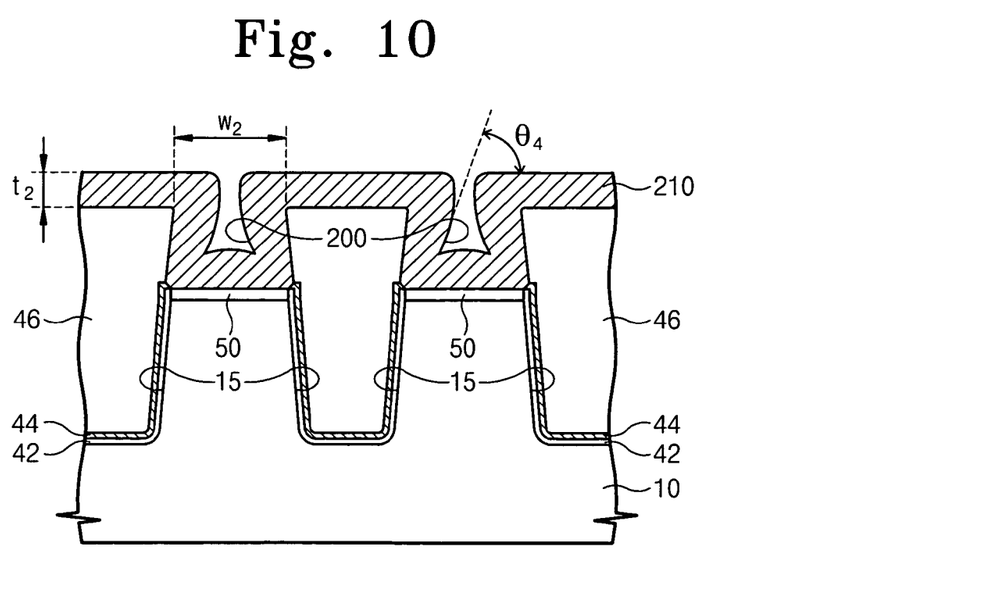
FIG. 10 through FIG. 13 are cross-sectional views illustrating methods for fabricating a floating gate electrode in a flash memory device according to some embodiments of the present invention.

As illustrated in FIG. 10, after removing the trench mask patterns 30, a first conductive layer 210 is formed on the surface of the device isolation layer 46 and the active region of the substrate 10. More particularly, the first conductive layer 210 is formed on sidewalls and on a bottom surface of a trench defined by the isolation layer 46 and the gate oxide layer 50 above the active region of the substrate 10. The first conductive layer 210 may be formed using chemical vapor deposition (CVD) and/or physical vapor deposition (PVD). The first conductive layer 210 may be formed to a thickness $t_2$ that is less than half of a distance $w_2$ between portions of the device isolation layer 46 (i.e., $t_2 < w_2/2$). As the sidewalls of the device isolation layer 46 are inclined at an angle $\theta_2$ as described above with reference to FIG. 2, gap regions 200 defined by the first conductive layer 210 are formed between portions of the device isolation layer 46. As discussed above with reference to FIG. 5, an inner sidewall of the gap region 200 may have an inclination angle $\theta_4$ that is less than 90 degrees.

Prior to the formation of the device isolation layer 46, a thermal oxide layer 42 may be formed on sidewalls of the trench 15, and a nitride liner 44 may be formed on the thermal oxide layer 42. Formation of the thermal oxide layer 42 may cure etching damages which may occur during the etching process that is used to form the trench 15. The nitride liner 44 may reduce penetration of charges into the device isolation layer 46 from the active region of the substrate 10.

Figure 11:
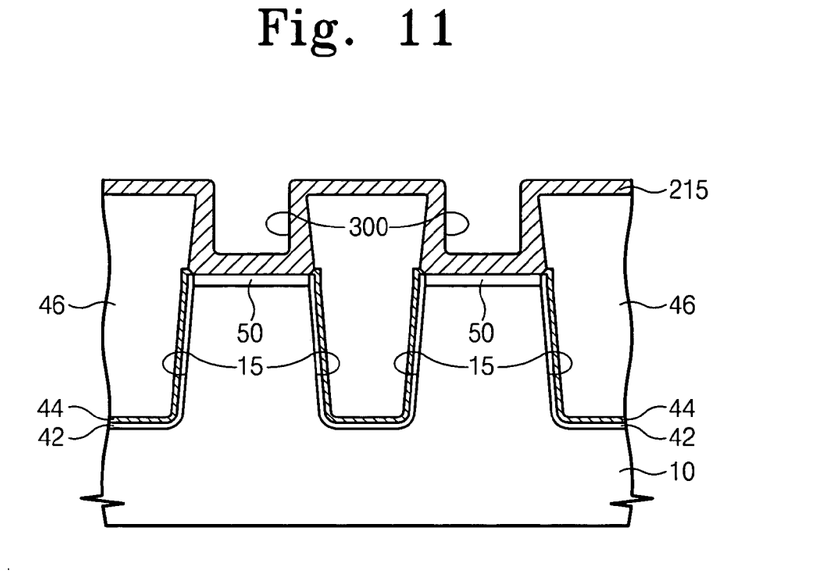

Referring to FIG. 11, the first conductive layer 210 is etched to increase the size of the gap region 200. Thus, a reduced first conductive layer 215 and a widened gap 300 may be formed. An upper width of the widened gap 300 is greater than or equal to a lower width thereof. In other words, the width of the widened gap 300 gradually decreases from top to bottom. Alternatively, the width may remain constant from top to bottom. The widened gap 300 may be formed by anisotropically etching the first conductive layer 210 using a dry etching process. As a result, a top portion of the widened gap 300 is exposed to increased etching, and as such, has a greater width than a bottom portion thereof, as similarly described with reference to the embodiments of FIG. 6.

Figure 12:
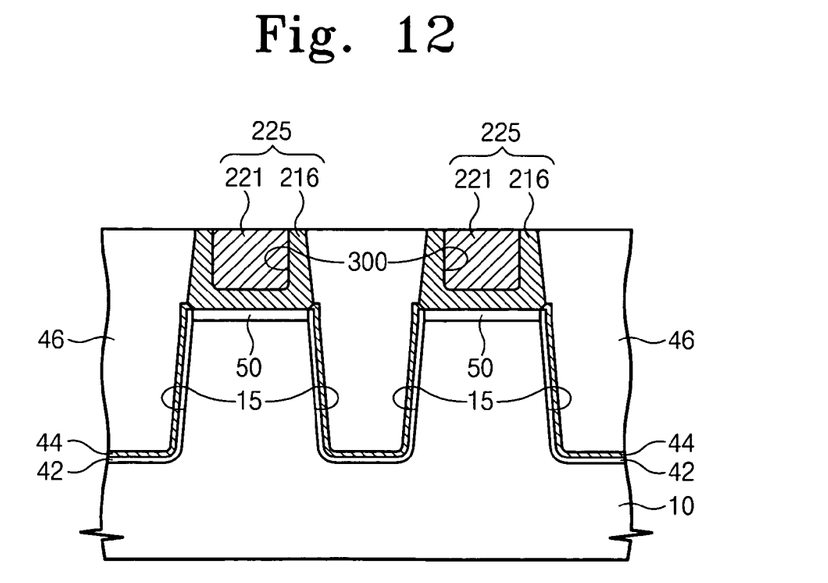

As illustrated in FIG. 12, a second conductive layer is formed on the reduced first conductive layer 215, including the widened gap 300. The second conductive layer fills the widened gap 300. The second conductive layer may be formed of the same material as the first conductive layer 210. As described above, since the top width of the widened gap 300 is wider than the bottom width thereof, step coverage problems may be less likely. As such, the second conductive layer may fill the widened gap 300 with a reduced possibility of void formation.

The second conductive layer and the reduced first conductive layer 215 are planarized until top surfaces of the device isolation layer 46 are exposed. As a result, a space between portions of the device isolation layer 46 is filled with a conductive pattern 225 including a first conductive pattern 216 and a second conductive pattern 221 which are stacked.

Figure 13:
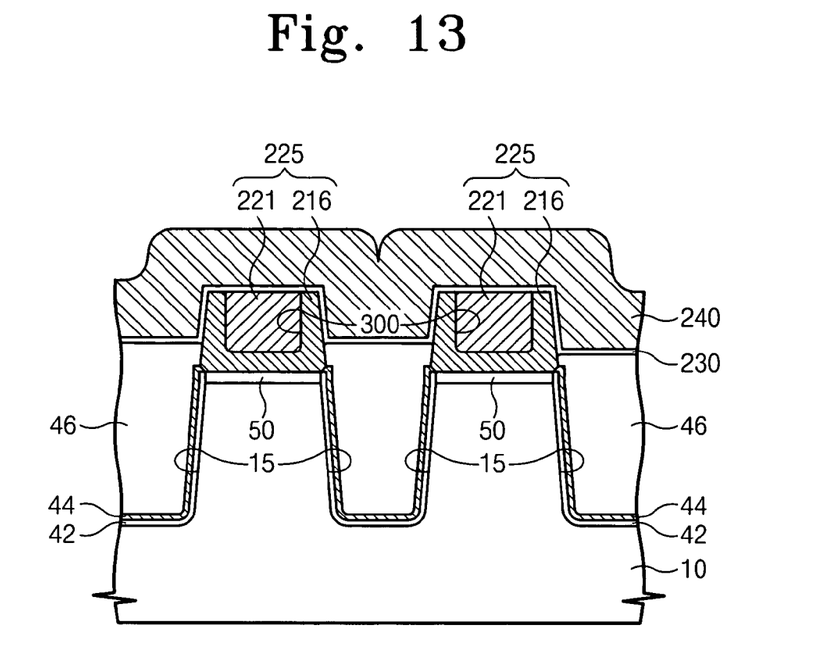

Referring to FIG. 13, an intergate dielectric 230 is formed on the conductive pattern 225 and the device isolation layer 46. A control gate conductive layer 240 is then formed on the intergate dielectric 230. As such, the conductive pattern 225 is electrically isolated from the control gate conductive layer 240 by the intergate dielectric 230. In order to form gate patterns for a flash memory device, the control gate conductive layer 240, the intergate dielectric 230, and the conductive pattern 225 may be selectively etched until top surfaces of the device isolation layer 46 are exposed. Thus, the conductive pattern 225 may form a floating gate electrode that is electrically insulated, and the control gate conductive layer 240 may form a control gate electrode that crosses over a plurality of floating gate electrodes. An intergate dielectric pattern, which is patterned from the intergate dielectric 230, is positioned between the floating gate electrode and the control gate electrode. The intergate dielectric pattern electrically isolates the floating gate electrode from the control gate electrode.

In order to increase the coupling ratio of the intergate dielectric pattern (i.e. the ratio of the capacitance between the floating gate electrode and the control gate electrode to the total floating gate capacitance), the surface area between the control gate electrode and the floating gate electrode may be increased. As such, the device isolation layer 46 may be etched to a level lower than that of a top surface of the conductive pattern 225 (as shown in FIG. 13) prior to formation of the control gate conductive layer 240.

Figure 14:
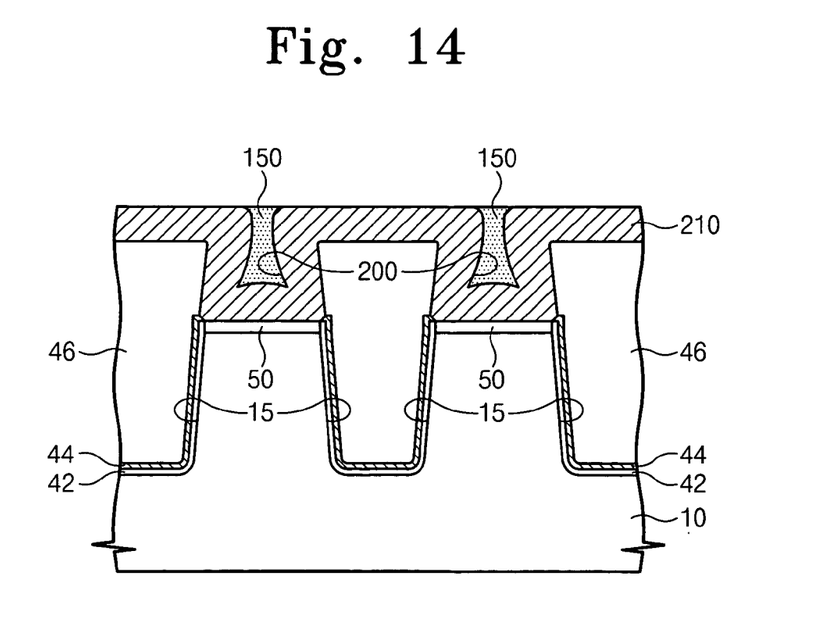
FIG. 14 and FIG. 15 are cross-sectional views illustrating methods for fabricating a floating gate electrode in a flash memory device according to further embodiments of the present invention.
Figure 15:
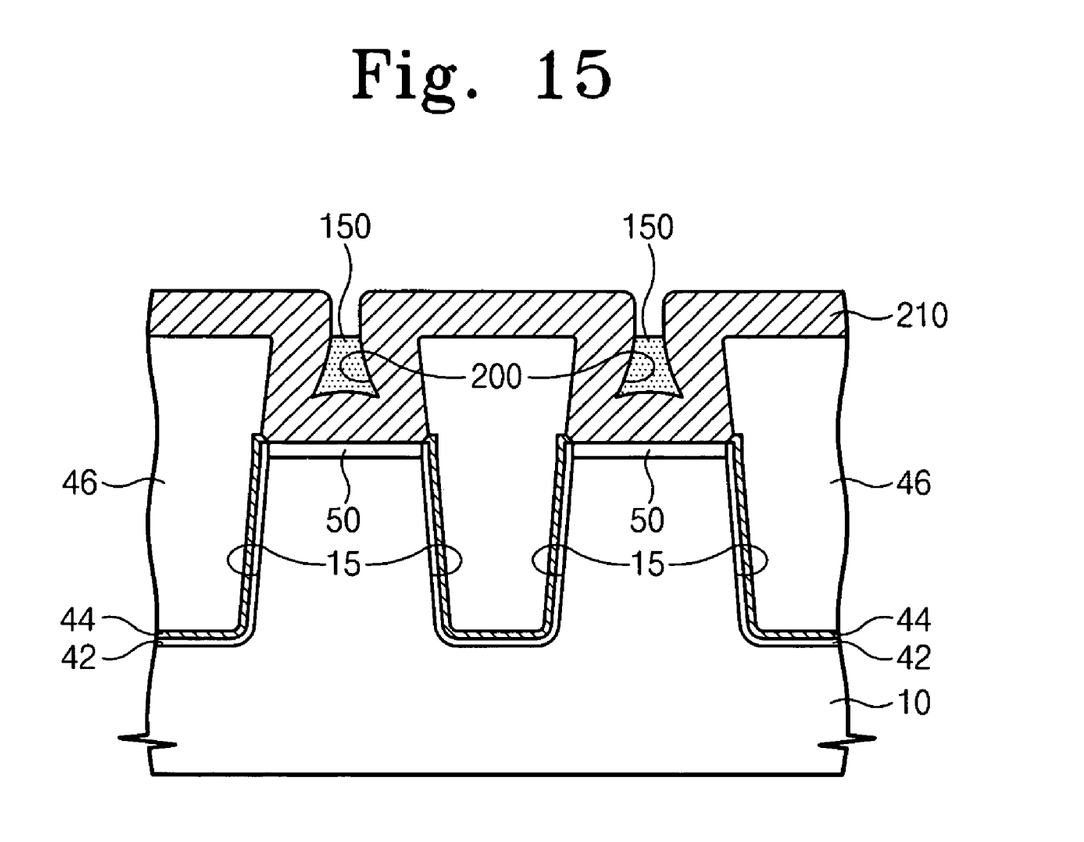

The widened gap 300 shown in FIG. 11 may also be formed using methods according to further embodiments of the present invention as described with reference to FIG. 14 and FIG. 15. These methods may be similar to the methods described with reference to FIG. 8 and FIG. 9. As shown in FIG. 14, after the first conductive layer 210 is formed on sidewalls and on a bottom surface of a trench defined by the isolation layer 46 and the substrate 10, an auxiliary pattern 150 is formed to fill the gap region 200 defined by the first conductive layer 210. The first conductive layer 210 is then etched to expose upper portions of the sidewalls of the gap region 200. In particular, the first conductive layer 210 is selectively etched such that the auxiliary pattern 150 is removed at a greater rate than the first conductive layer 210. Thus, as shown in FIG. 15, the upper sidewalls of the gap region 200 are exposed. Accordingly, the exposed upper sidewalls of the gap region 200 may be etched to a greater extent than the bottom sidewalls thereof to form the widened gap 300.

Figure 16:
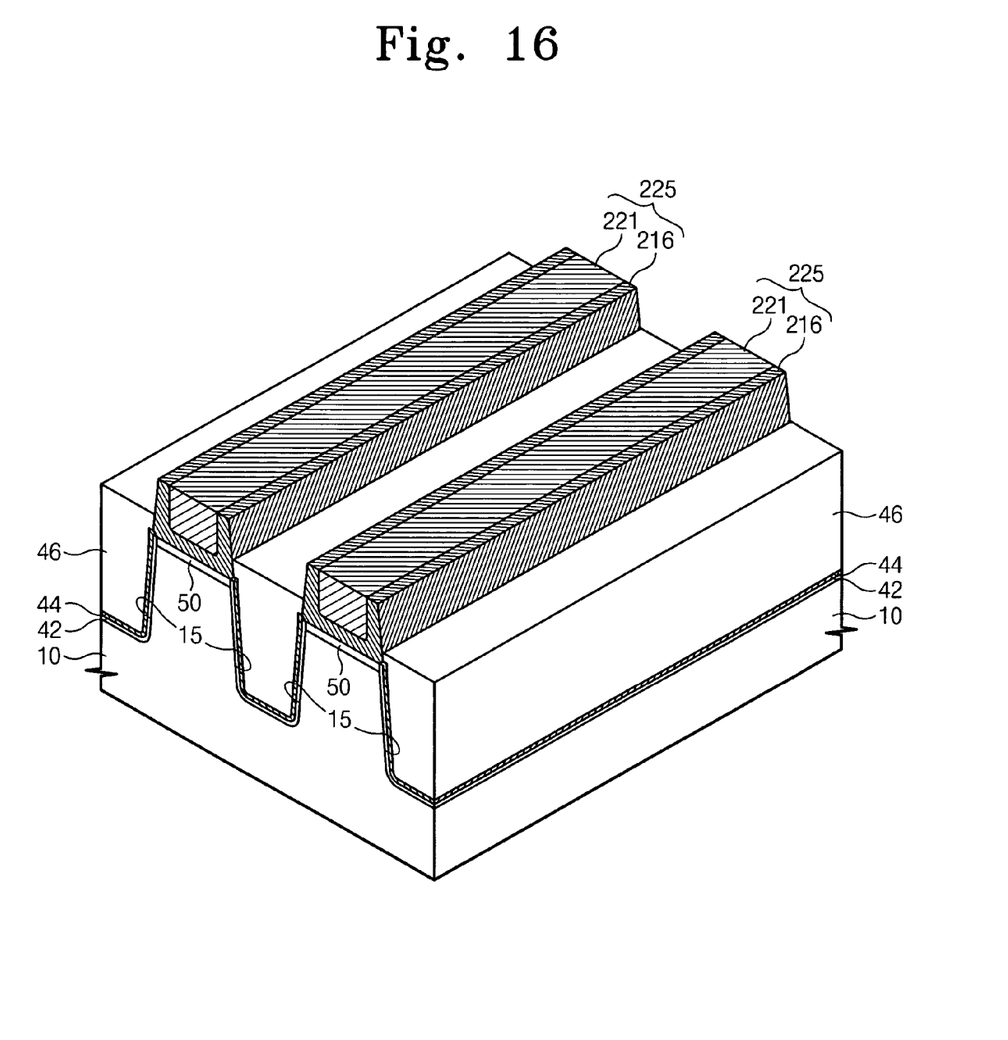
FIG. 16 is a perspective view illustrating a gate pattern structure in a flash memory device according to some embodiments of the present invention.

A gate pattern structure in flash memory device according to some embodiments of the present invention is illustrated in FIG. 16. Referring now to FIG. 16, a device isolation layer 46 is formed at predetermined regions of a semiconductor substrate 10 to define transistor active regions. First conductive patterns 216 are formed on the active regions to define widened trench areas 300. Each of the first conductive patterns 216 has opposing sidewall portions and a bottom portion. The widened trench area 300 is filled with the second conductive pattern 221, so that the second conductive pattern 221 is formed over the first conductive pattern 216. The first and second conductive patterns 216 and 221 may be formed of the same material, such as polysilicon.

Still referring to FIG. 16, a top width of the widened trench area 300 is greater than or equal to a bottom width thereof. More particularly, an inner sidewall of the first conductive pattern 216 may have an inclination angle $\theta_i$ of at least 90 degrees or more, such that the width of the second conductive pattern 221 gradually decreases from top to bottom. Upper portions of the sidewalls of the first conductive pattern 216 may be thinner than lower portions thereof, so that an outer sidewall of the first conductive pattern 216 may have an inclination angle $\theta_o$ of 90 degrees or less. As such, the width of the device isolation layer 46 also gradually decreases from top to bottom.

According to embodiments of the present invention, after a first conductive layer is formed to define a gap area, the first conductive layer may be etched in order to widen an upper opening of the gap area. As such, step coverage problems may be avoided, and a second conductive layer may fill the gap area without the formation of voids. Thus, methods according to some embodiments of the present invention can reduce the likelihood of void formation in semiconductor device fabrication. Furthermore, methods according to some embodiments of the present invention may be applicable to processes for fabricating floating gate electrodes for flash memory devices. As void-based problems may be reduced and/or eliminated, the surface of a floating gate electrode that is connected to a control gate electrode may be uniform. As a result, flash memory devices having more uniform electrical characteristics can be fabricated.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A method of forming a semiconductor device, comprising:
   forming an insulating layer on a semiconductor substrate, the insulating layer having a trench therein with opposing sidewalls and a bottom surface;
   forming a first conductive layer on the sidewalls and on the bottom surface of the trench to define a gap region;
   forming an auxiliary pattern in the gap region;
   removing a portion of the first conductive layer to thereby increase a width of the gap region; and
   forming a second conductive layer in the gap region after removing the portion of the first conductive layer to fill the gap region,
   wherein removing a portion of the first conductive layer comprises etching the first conductive layer, and wherein the auxiliary pattern has a higher etch rate than the first conductive layer.

2. The method of claim 1, wherein removing a portion of the first conductive layer comprises removing a portion of the first conductive layer from the sidewalls and the bottom surface of the trench such that an upper width of the gap region is greater than or equal to a lower width of the gap region.

3. The method of claim 1, wherein forming the insulating layer comprises forming the insulating layer to define a trench having sidewalls inclined at an angle of no greater than 90 degrees, and wherein removing a portion of the first conductive layer comprises etching the first conductive layer to form a widened gap region having sidewalls inclined at an angle of at least 90 degrees.

4. The method of claim 3, wherein etching the first conductive layer comprises etching a portion of the first conductive layer on upper sidewalls of the trench to a greater extent than portions of the first conductive layer on lower sidewalls of the trench such that a width of the widened gap region gradually decreases from top to bottom.

5. The method of claim 3, wherein etching the first conductive layer comprises etching the first conductive layer using a wet and/or dry etch-back process.

6. The method of claim 1, wherein removing a portion of the first conductive layer further comprises removing the auxiliary pattern.

7. The method of claim 1, wherein the auxiliary pattern comprises an insulating material.

8. The method of claim 1, wherein the auxiliary pattern comprises silicon oxide, silicon nitride, silicon oxynitride, and/or spin-on glass (SOG).

9. The method of claim 1, wherein the first and second conductive layers comprise a same material.

10. The method of claim 1, wherein the first and second conductive layers comprise polysilicon.

11. The method of claim 1, wherein forming a first conductive layer comprises forming the first conductive layer to a thickness that is less than half of a distance between the sidewalls of the trench.

12. The method of claim 1, wherein forming a first conductive layer further comprises forming the first conductive layer on the insulating layer outside the trench, the method further comprising:
   after forming the second conductive layer, planarizing the first conductive layer to expose a top surface of the insulating layer.

13. The method of claim 1, wherein forming a first conductive layer further comprises forming the first conductive layer on the insulating layer outside the trench, the method further comprising:
   before forming the second conductive layer, planarizing the first conductive layer to expose a top surface of the insulating layer.

14. The method of claim 1, wherein the insulating layer is a device isolation layer, and wherein forming the insulating layer comprises:
   forming a trench mask pattern on an active region of the substrate;
   etching the substrate around the mask pattern to form trenches on either side of the active region;
   forming the device isolation layer on the substrate to fill the trenches on either side of the active region;
   planarizing the device isolation layer to expose a top surface of the trench mask pattern; and
   removing the trench mask pattern.

15. The method of claim 1, wherein forming the first conductive layer comprises forming the first conductive layer using physical vapor deposition (PVD) and/or low pressure chemical vapor deposition (LPCVD).

16. A method of forming a memory device, comprising:
   forming a device isolation layer on a semiconductor substrate to define a trench having opposing sidewalls and a bottom surface above an active region of the substrate;
   forming an oxide layer on the bottom surface of the trench;

forming a first conductive layer on the sidewalls and on the bottom surface of the trench to define a gap region;

forming an auxiliary pattern in the gap region, wherein the auxiliary pattern has a higher etch rate than the first conductive layer;

removing a portion of the first conductive layer to thereby increase a width of the gap region, wherein removing a portion of the first conductive layer comprises etching the first conductive layer;

forming a second conductive layer in the gap region after removing the portion of the first conductive layer;

forming a dielectric layer on the first and second conductive layers; and forming a control gate electrode on the dielectric layer.

17. The method of claim 16, wherein removing a portion of the first conductive layer comprises removing a portion of the first conductive layer from the sidewalls and the bottom surface of the trench such that an upper width of the gap region is greater than or equal to a lower width of the gap region.

18. The method of claim 16, wherein forming the device isolation layer comprises forming the device isolation layer to define a trench having sidewalls inclined at an angle of no greater than 90 degrees, and wherein removing a portion of the first conductive layer comprises etching the first conductive layer to form a widened gap region having sidewalls inclined at an angle of at least 90 degrees.

19. The method of claim 16, wherein removing a portion of the first conductive layer further comprises removing the auxiliary pattern.

20. The method of claim 16, wherein the auxiliary pattern comprises silicon oxide, silicon nitride, silicon oxynitride, and/or spin-on glass (SOG).

21. The method of claim 16, wherein the first and second conductive layers comprise polysilicon.

22. A method for forming a pattern of a semiconductor device, comprising:

forming mold patterns on a predetermined region of a semiconductor substrate;

depositing a first material layer on a resultant structure where the mold patterns are formed, to form a gap area having a top region and a bottom region between the mold patterns;

forming an auxiliary pattern in the gap area while exposing a top surface of the first material layer, wherein the auxiliary pattern is made of a material having a higher etch rate than the first material layer;

etching the first material layer to widen the gap area, wherein a top width of the widened gap area is larger than or equal to a bottom width thereof;

forming a second material layer on a resultant structure including the etched first material layer to fill the widened gap area; and planarizing the second material layer and the etched first material layer to expose top surfaces of the mold patterns.

23. The method as recited in claim 22, wherein the forming mold patterns comprises:

forming trench mask patterns on the semiconductor substrate;

using the trench mask patterns as an etch mask, anisotropically etching the semiconductor substrate to form a trench defining the active region;

forming a device isolation layer on a resultant structure where the trench mask patterns are formed, to fill the trench;

planarizing the device isolation layer to form the mold patterns exposing the top surfaces of the trench mask patterns; and removing the exposed trench mask patterns.

24. The method as recited in claim 23, wherein the first and second material layers are made of polysilicon.

25. The method as recited in claim 22, wherein the forming the first material layer is conducted using physical vapor deposition (PVD) and/or low pressure chemical vapor deposition (LPCVD), the first material layer having a thickness that is smaller than half of a minimum space between the mold patterns.

26. The method as recited in claim 22, wherein the etching the first material layer is conducted using an etch-back process performed by dry etch or wet etch.

27. The method as recited in claim 22, wherein the auxiliary pattern is made of at least one selected from the group consisting of silicon oxide, silicon nitride, silicon oxynitride, and SOG.

28. A method for forming a gate pattern of a semiconductor device, comprising:

forming trench mask patterns on a semiconductor substrate;

using the trench mask patterns as an etch mask, anisotropically etching the semiconductor substrate to form a trench defining an active region;

forming a device isolation layer on a resultant structure where the trench mask patterns are formed, to fill the trench;

planarizing the device isolation layer to form device isolation layer patterns exposing the trench mask patterns;

removing the exposed trench mask patterns;

depositing a first conductive layer on a resultant structure where the trench mask patterns are removed, to form a gate trench area having a top region and a bottom region at a space where the trench mask patterns are removed;

forming an auxiliary pattern in the gate trench area while exposing a top surface of the first conductive layer, wherein the auxiliary pattern is made of a material having a higher etch rate than the first conductive layer;

etching the first conductive layer to widen the gate trench area, wherein a top width of the widened gate trench area is larger than or equal to a bottom width thereof;

forming a second conductive layer on a resultant structure including the etched first conductive layer to fill the widened gate trench area; and planarizing the second conductive layer and the etched first conductive layer to expose top surfaces of the device isolation layer patterns.

29. The method as recited in claim 28, wherein the first and second conductive layers are made of polysilicon.

30. The method as recited in claim 28, wherein the forming the first conductive layer is conducted using low pressure chemical vapor deposition (LPCVD), the first conductive layer having a thickness that is smaller than a half minimum space between the device isolation layer patterns.

31. The method as recited in claim 28, wherein the etching the first conductive layer is conducted using an etch-back process performed by dry etch or wet etch.

32. The method as recited in claim 28, wherein the auxiliary pattern is made of at least one selected from the group consisting of silicon oxide, silicon nitride, silicon oxynitride, and SOG.

* * * * *